United States Patent
Rief

(10) Patent No.: US 12,547,086 B2
(45) Date of Patent: Feb. 10, 2026

(54) PROJECTION EXPOSURE APPARATUS FOR SEMICONDUCTOR LITHOGRAPHY

(71) Applicant: Carl Zeiss SMT GmbH, Oberkochen (DE)

(72) Inventor: Klaus Rief, Aalen-Oberalfingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 121 days.

(21) Appl. No.: 18/526,844

(22) Filed: Dec. 1, 2023

(65) Prior Publication Data

US 2024/0111223 A1 Apr. 4, 2024

Related U.S. Application Data

(63) Continuation of application No. PCT/EP2022/066825, filed on Jun. 21, 2022.

(30) Foreign Application Priority Data

Jun. 22, 2021 (DE) ..................... 10 2021 206 427.2

(51) Int. Cl.
*G03F 7/00* (2006.01)
*G02B 7/18* (2021.01)
*G02B 27/64* (2006.01)

(52) U.S. Cl.
CPC .......... *G03F 7/709* (2013.01); *G03F 7/70891* (2013.01); *G02B 7/1815* (2013.01); *G02B 27/646* (2013.01)

(58) Field of Classification Search
CPC .. G03F 7/70891; G03F 7/709; F16L 55/0338; F04B 39/0027; F04B 39/0038; F04B 39/005
See application file for complete search history.

(56) References Cited

U.S. PATENT DOCUMENTS

| | | | |
|---|---|---|---|
| 6,573,978 B1 | 6/2003 | McGuire, Jr. | |
| 2004/0165161 A1 | 8/2004 | Hara et al. | |
| 2006/0132747 A1 | 6/2006 | Singer et al. | |
| 2007/0242245 A1* | 10/2007 | Wijckmans | G03F 7/70875 355/53 |
| 2013/0098456 A1* | 4/2013 | Charlton | F04B 43/02 137/565.17 |

(Continued)

FOREIGN PATENT DOCUMENTS

| | | |
|---|---|---|
| DE | 10 2008 009 600 A1 | 8/2009 |
| DE | 10 2017 220 586 A1 | 5/2019 |

(Continued)

OTHER PUBLICATIONS

International Search Report and Written Opinion for corresponding PCT Appl No. PCT/EP2022/066825, dated Oct. 28, 2022.

*Primary Examiner* — Steven H Whitesell
(74) *Attorney, Agent, or Firm* — Fish & Richardson P.C.

(57) ABSTRACT

A projection exposure apparatus for semiconductor lithography includes component having a fluid channel and a device for providing a fluid for flowing through the fluid channel. The fluid channel is connected to the device via a supply line and an outgoing line. The supply line and the outgoing line are connected to one another in parallel with the fluid channel via a short circuit.

20 Claims, 4 Drawing Sheets

(56) References Cited

U.S. PATENT DOCUMENTS

2013/0323649 A1\* 12/2013 Watson ................ G03F 7/709
 165/69
2018/0074303 A1 3/2018 Schwab
2022/0350265 A1\* 11/2022 Nakiboglu .......... G03F 7/70891

FOREIGN PATENT DOCUMENTS

| EP | 1843206 A2 | 10/2007 |
| EP | 1843206 A3 | 11/2008 |
| WO | WO 2015090753 A1 | 6/2015 |
| WO | WO 2016177511 A1 | 11/2016 |
| WO | WO 2021013441 A1 | 1/2021 |

\* cited by examiner

PROJECTION EXPOSURE APPARATUS FOR SEMICONDUCTOR LITHOGRAPHY

CROSS-REFERENCE TO RELATED APPLICATIONS

The present application is a continuation of, and claims benefit under 35 USC 120 to, international application PCT/EP2022/066825, filed Jun. 21, 2022, which claims benefit under 35 USC 119 of German Application No 10 2021 206 427.2, filed Jun. 22, 2021. The entire disclosure of each these applications is incorporated by reference herein.

FIELD

The disclosure relates to a projection exposure apparatus for semiconductor lithography having at least one component having a fluid channel and a device for providing a fluid for flowing through the fluid channel.

BACKGROUND

Projection exposure apparatuses for semiconductor lithography can be subject to extremely stringent expectations with respect to imaging quality in order to be able to produce the desired microscopically small structures as far as reasonably possible without defects. In a lithography process or a microlithography process, an illumination system illuminates a photolithographic mask, also referred to as a reticle. The light passing through the mask or the light reflected by the mask is projected, via a projection optical unit, onto a substrate (e.g. a wafer) which is coated with a light-sensitive layer (photoresist) and fitted in the image plane of the projection optical unit in order to transfer the structure elements of the mask to the light-sensitive coating of the substrate. The expected properties with respect to the positioning of the imaging on the wafer and the intensity of the light provided by the illumination system generally increase with every new generation, which can result in a generally higher thermal load on the optical elements.

In cases of high thermal load, it may be advantageous for the optical elements embodied as mirrors in EUV projection exposure apparatuses, that is to say in apparatuses which are operated with electromagnetic radiation having a wavelength of between 1 nm and 120 nm, such as at 13.5 nm, to be temperature-regulated via water cooling. In DUV projection exposure apparatuses, too, that is to say in apparatuses which are operated with electromagnetic radiation having a wavelength of between 120 nm and 300 nm, water-cooled mirrors may be used. The mirrors can comprise fluid channels through which temperature-regulated water flows and which thereby can dissipate the heat from the optical effective surface, that is to say the mirror surface impinged on by the light used for imaging the structure elements. In this case, it is possible to avoid dynamic or mechanical excitation, inter alia also as a result of so-called flow-induced vibrations, since any such excitation can disturb the imaging processes of the projection exposure apparatus. The flow-induced vibrations can result firstly in a change in the position of the mirrors and secondly in a deformation of the optical effective surface of the mirrors, with both disturbances possibly having an adverse influence on the imaging quality of the projection exposure apparatus.

In this case, the excitation as a result of flow-induced vibrations includes a local portion and a received portion. The local portion is that portion which arises in a component such as a mirror, for example, at deflections, cross-sectional changes or similar changes in the fluid guidance and introduces forces into the mirror directly at the arising location. The received portion involves acoustic waves which travel through the fluid in the form of pressure fluctuations and introduce forces elsewhere in the system, such as in the mirrors, for example, and thereby cause disturbances far from the actual arising location. These pressure fluctuations can occur as standing waves to a first approximation and may be generated very far outside the mirrors in the apparatus, such as, for example, in a different component of the lens or in a water cabinet, that is to say the component in which the fluid used for regulating the temperature of the mirrors or other components is temperature-regulated, conditioned and provided.

In order to reduce the effects of flow-induced vibrations described further above, a series of measures have already been implemented in the prior art, such as, for example, an optimization of the fluid channels in the mirror, but also of the supply lines from the water cabinet to the mirror in order to reduce the flow-induced vibrations. As a result of the desired properties of the product generally increasing with every generation, the measures taken hitherto, such as with regard to the received portions, are often no longer sufficient to satisfy these desired properties.

SUMMARY

The present disclosure seeks to provide an improved device.

In an aspect, the disclosure provides a projection exposure apparatus for semiconductor lithography, wherein the apparatus comprises at least one component having a fluid channel and a device for providing a fluid for flowing through the fluid channel, the fluid channel being connected to the device by way of a supply line and an outgoing line, the supply line and the outgoing line being connected to one another in parallel with the fluid channel via a short circuit.

The presence of the short circuit can mean that the average pressure difference upstream and downstream of the component embodied as a mirror, for example, which is composed firstly of the pressure loss in the fluid channel of the mirror and secondly of the varying average pressure of the pressure fluctuations upstream and downstream of the mirror, is equalized. As a result of the symmetry produced in this way with regard to the forces acting on the mirror on the basis of the flow-induced vibrations, displacements of the mirror and/or deformations of an optical effective surface of the mirror can be effectively reduced.

For example, the short circuit can be arranged on a frame decoupled from the component, in particular the mirror. The short circuit, for its part, can be connected to the fluid channel of the mirror by way of connecting elements which have a decoupling effect. This can mean that the disturbances occurring in the short circuit as a result of the flow-induced vibrations are absorbed by the frame and do not act on the component, that is to say that an additional decoupling of the flow-induced vibrations with respect to the mirror can be provided.

In an embodiment, the short circuit can be embodied as a flow short circuit. This can mean that the enlarged flow cross-section in comparison with the fluid channel results in a reduction of the pressure fluctuations. The amplitudes and, in the case of periodic pressure fluctuations, the frequencies which pass through the fluid channel of the mirror can be set depending on the configuration of the ratio of volumetric flow rate in the short circuit and in the component.

In an embodiment of the disclosure, the short circuit is an acoustic short circuit. In this case, an acoustic short circuit is understood to mean a short circuit which does not experience a fluid flowing through it but passes on pressure fluctuations or pressure surges.

For example, the acoustic short circuit can comprise a membrane which can prevent the fluid from flowing through the short circuit, but owing to its compliance can pass on the pressure fluctuations in the fluid and thereby equalizes the pressure upstream of the mirror and downstream of the mirror. The reduced volumetric flow rate in relation to the flow short circuit may have the advantage that the volumetric flow rate in the supply lines can be significantly reduced in comparison with a flow short circuit and the control of the volumetric flow rate through the fluid channel of the component is simplified or the volumetric flow rate through the component remains constant.

In an embodiment of the disclosure, the acoustic short circuit comprises a double membrane. Depending on the properties of a fluid used in a volume between the membranes, it is possible to set the effect of the short circuit with a double membrane.

For example, the volume formed between the two membranes of the double membrane can have a compressible medium. The membranes separate the fluid of the supply line and of the outgoing line from the volume formed between the membranes. Besides the features of an acoustic short circuit with a single membrane that have been described further above, this embodiment can mean that owing to the compliance of the compressible medium, which comprises a gas, for example, a standing pressure fluctuation wave formed in the fluid channel is interrupted, as a result of which the large amplitudes of the pressure fluctuation are transformed into fluctuations of the flow velocity of the fluid. The forces acting on the short circuit in this case, as explained further above, can be absorbed by a frame decoupled from the component and are thereby kept away from the latter. Furthermore, the reduction of the amplitudes of the pressure fluctuation can result in smaller excitations in the fluid channel of the component, which can result in smaller mechanical disturbances as a result of flow-induced vibrations. The compressible volume formed between the membranes can act like a spring, where the pressure in the volume in conjunction with the stiffness of the membranes can be regarded as spring stiffness, that is to say that a pressure change in the volume can cause a change in the spring stiffness of the compliance. This can mean that the bandwidth of the compliance of the short circuit, the compliance acting as a frequency filter for the pressure fluctuations, can be set by way of the pressure of the volume between the membranes. In some cases, the static pressure in the fluid system, that is to say outside the volume formed between the membranes, is kept constant in order to avoid deformations of the component, such as a mirror.

In an embodiment of the disclosure, the volume formed between the membranes of the double membrane can comprise a damping element. The latter can absorb at least part of the energy of the pressure fluctuations and thereby further reduce the level of the pressure fluctuations and thus of the flow-induced vibrations.

Furthermore, the device for providing the fluid can comprise a pressure control unit. In this case, besides a water cabinet, that is to say the component in the device which conditions, temperature-regulates and provides the fluid, the device also can comprise the supply line and outgoing line, the short circuit and the connecting lines to the mirror. The pressure control unit can be arranged in the water cabinet or elsewhere outside a projection optical unit. The pressure control unit can control the pressure in the fluid channel, which can have a direct influence on the shape of the optical effective surface and therefore desirably corresponds to a nominal pressure taken as a basis in the production of the optical effective surface.

For example, the pressure control unit can be connected to the volume formed between the membranes of the double membrane. The connection can be a gas line, for example.

Furthermore, the pressure control unit can detect the pressure in the volume formed between the membranes of the double membrane, as a result of which the pressure in the fluid channel of the mirror can be determined by way of the pressure in the volume. The pressure can be detected by way of a pressure sensor and can be evaluated in the pressure control unit. The connection via a gas line can mean that the latter involves a smaller structural space in the region of the mirror than a pressure sensor, which would be conceivable as an alternative given the available structural space.

In addition, the pressure control unit can comprise an actuator for setting, in particular increasing, the pressure in the volume formed between the membranes of the double membrane. As a result, as described further above, it is possible to set the compliance of the volume and to set the bandwidth of the volume acting as a filter.

For example, the pressure control unit can be configured to control and/or regulate the pressure in the volume formed between the membranes of the double membrane. This may be desirable when the flow-induced vibrations caused by pressure fluctuations vary, for example as a result of different desired properties with respect to the quantity of heat to be dissipated in the mirror, thus resulting for example in a change in the volumetric flow rate in the mirror and hence also in the pressure in the fluid system, which can comprise the water cabinet, the supply line, the outgoing line, the short circuit, the connecting lines and the fluid channel in the component. In the case of a closed pressure-constant fluid system, that is to say a system in which the pressure is not maintained by a pump, rather the pump is only used to generate a volumetric flow rate after the pressure has been set, the pressure of the fluid system can be set by way of increasing the pressure in the volume between the membranes. The order of magnitude of the pressure fluctuations relevant to a disturbance may be in a range of between one pascal and a few hundred pascals, which may correspond to the range of a pressure change achieved by way of a pressure change in the volume between the membranes. Moreover, the pressure change is generally dependent, of course, on the concrete dimensions of the fluid system.

BRIEF DESCRIPTION OF THE DRAWINGS

Embodiments and variants of the disclosure are explained in greater detail below with reference to the drawing. In the figures.

DETAILED DESCRIPTION

Figure 1:
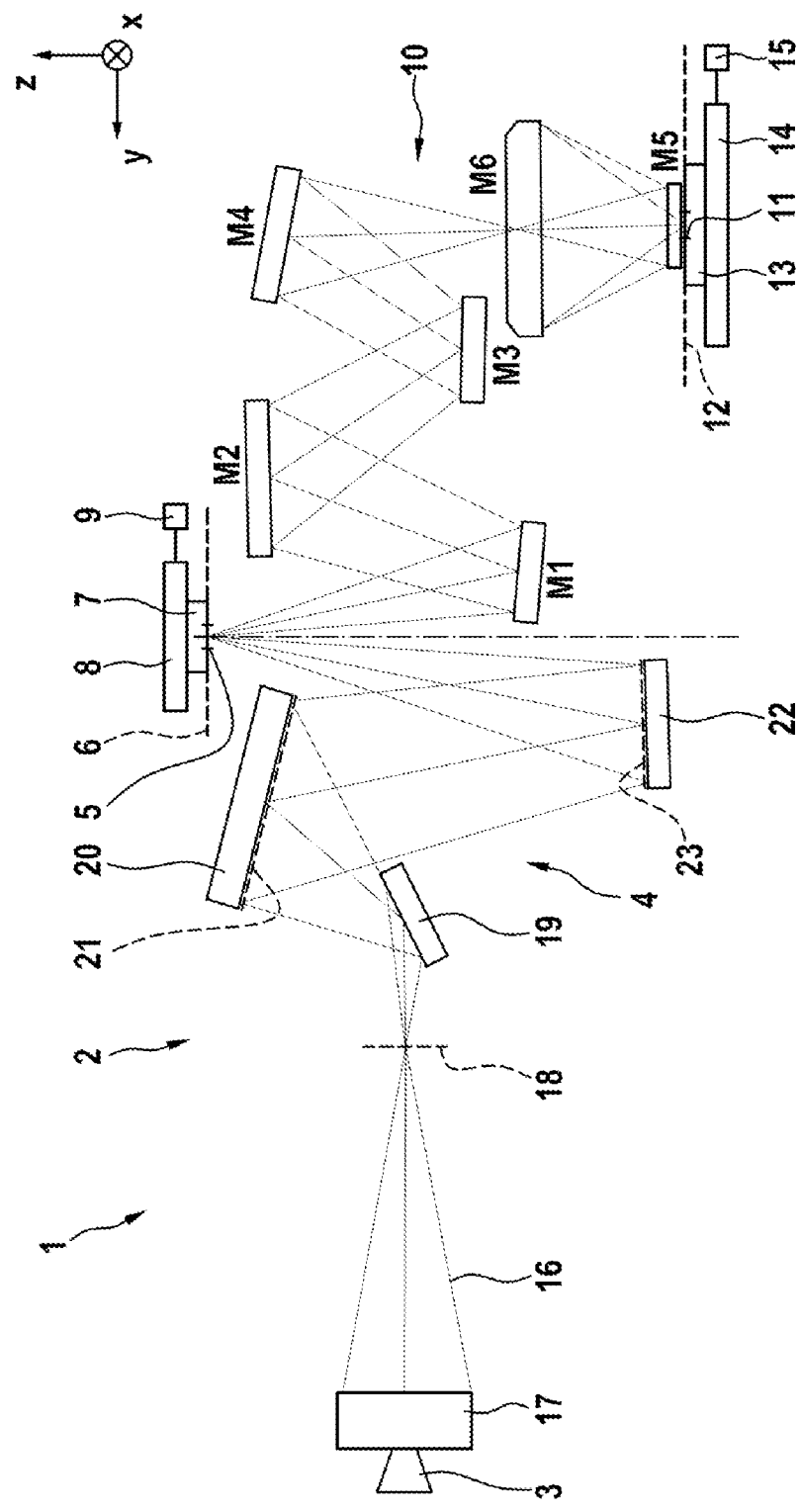
FIG. 1 schematically shows a meridional section of a projection exposure apparatus for EUV projection lithography, FIG. 2 schematically shows a meridional section of a further projection exposure apparatus for DUV projection lithography.

Certain integral parts of a microlithographic projection exposure apparatus 1 are described in exemplary fashion below initially with reference to FIG. 1. The description of the fundamental construction of the projection exposure apparatus 1 and the integral parts thereof is understood here to be non-limiting.

One embodiment of an illumination system 2 of the projection exposure apparatus 1 has, in addition to a radiation source 3, an illumination optical unit 4 for illuminating an object field 5 in an object plane 6. In an alternative embodiment, the light source 3 can also be provided as a module separate from the rest of the illumination system. In this case, the illumination system does not comprise the light source 3.

A reticle 7 arranged in the object field 5 is exposed. The reticle 7 is held by a reticle holder 8. The reticle holder 8 is displaceable by way of a reticle displacement drive 9, in particular in a scanning direction.

A Cartesian xyz-coordinate system is shown in FIG. 1 for explanation purposes. The x-direction runs perpendicular to the plane of the drawing into the latter. The y-direction runs horizontally and the z-direction runs vertically. The scanning direction runs along the y-direction in FIG. 1. The z-direction runs perpendicular to the object plane 6.

The projection exposure apparatus 1 comprises a projection optical unit 10. The projection optical unit 10 serves for imaging the object field 5 into an image field 11 in an image plane 12. The image plane 12 runs parallel to the object plane 6. Alternatively, an angle between the object plane 6 and the image plane 12 that differs from 0° is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example along the y-direction. The displacement, firstly, of the reticle 7 by way of the reticle displacement drive 9 and, secondly, of the wafer 13 by way of the wafer displacement drive 15 can be implemented so as to be synchronized with one another.

The radiation source 3 is an EUV radiation source. The radiation source 3 emits EUV radiation 16, which is also referred to below as used radiation, illumination radiation or illumination light. For example, the used radiation has a wavelength in the range of between 5 nm and 30 nm. The radiation source 3 can be a plasma source, for example an LPP (laser produced plasma) source or a GDPP (gas discharge produced plasma) source. It can also be a synchrotron-based radiation source. The radiation source 3 can be a free electron laser (FEL).

The illumination radiation 16 emerging from the radiation source 3 is focused by a collector 17. The collector 17 can be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 can be structured and/or coated, firstly, for optimizing its reflectivity for the used radiation and, secondly, for suppressing extraneous light.

Downstream of the collector 17, the illumination radiation 16 propagates through an intermediate focus in an intermediate focal plane 18. The intermediate focal plane 18 can represent a separation between a radiation source module, having the radiation source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. Alternatively or in addition, the deflection mirror 19 can be in the form of a spectral filter which separates a used light wavelength of the illumination radiation 16 from extraneous light with a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which are also referred to below as field facets. FIG. 1 depicts only some of the facets 21 by way of example.

The first facets 21 can be embodied as macroscopic facets, such as rectangular facets or as facets with an arcuate edge contour or an edge contour of part of a circle. The first facets 21 can be embodied as plane facets or, alternatively, as convexly or concavely curved facets.

As known for example from DE 10 2008 009 600 A1, the first facets 21 themselves can also be composed in each case of a multiplicity of individual mirrors, such as a multiplicity of micromirrors. In particular, the first facet mirror 20 can be embodied as a microelectromechanical system (MEMS system). For details, reference is made to DE 10 2008 009 600 A1.

Between the collector 17 and the deflection mirror 19, the illumination radiation 16 travels horizontally, that is to say along the y-direction.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1 and U.S. Pat. No. 6,573,978.

The second facet mirror 22 comprises a plurality of second facets 23. In the case of a pupil facet mirror, the second facets 23 are also referred to as pupil facets.

The second facets 23 can likewise be macroscopic facets, which can, for example, have a round, rectangular or hexagonal boundary, or alternatively be facets composed of micromirrors. In this regard, reference is likewise made to DE 10 2008 009 600 A1.

The second facets 23 can have plane or alternatively convexly or concavely curved reflection surfaces.

The illumination optical unit 4 consequently forms a doubly faceted system. This principle is also referred to as a fly's eye condenser (fly's eye integrator).

It can be desirable to arrange the second facet mirror 22 not exactly in a plane that is optically conjugate to a pupil plane of the projection optical unit 10. For example, the pupil facet mirror 22 can be arranged so as to be tilted relative to a pupil plane of the projection optical unit 10, as is described, for example, in DE 10 2017 220 586 A1.

The individual first facets 21 are imaged into the object field 5 with the aid of the second facet mirror 22. The second facet mirror 22 is the last beam-shaping mirror or else, in fact, the last mirror for the illumination radiation 16 in the beam path upstream of the object field 5.

In a further embodiment, not shown, of the illumination optical unit 4, a transfer optical unit contributing to the imaging of the first facets 21 into the object field 5 can be arranged in the beam path between the second facet mirror 22 and the object field 5. The transfer optical unit can comprise exactly one mirror or else, alternatively, two or more mirrors, which are arranged in succession in the beam path of the illumination optical unit 4. The transfer optical unit can comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the field facet mirror 20 and the pupil facet mirror 22.

In a further embodiment, the deflection mirror can be dispensed with so that the illumination optical unit 4 then has exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is, in general, only approximate imaging.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve or any other number of mirrors Mi are likewise possible. The penultimate mirror M5 and the last mirror M6 each have a through opening for the illumination radiation 16. The projection optical unit 10 is a double-obscured optical unit. The projection optical unit 10 has an image-side numerical aperture which is greater than 0.5 and which can also be greater than 0.6 and, for example, be 0.7 or 0.75.

Reflection surfaces of the mirrors Mi can be embodied as free-form surfaces without an axis of rotational symmetry. Alternatively, the reflection surfaces of the mirrors Mi can be designed as aspheric surfaces with exactly one axis of rotational symmetry of the reflection surface shape. Just like the mirrors of the illumination optical unit 4, the mirrors Mi can have highly reflective coatings for the illumination radiation 16. These coatings can be designed as multilayer coatings, for example with alternating layers of molybdenum and silicon.

The projection optical unit 10 has a large object-image offset in the y-direction between a y-coordinate of a centre of the object field 5 and a y-coordinate of the centre of the image field 11. This object-image offset in the y-direction can be of approximately the same magnitude as a z-distance between the object plane 6 and the image plane 12.

Optionally, the projection optical unit 10 can have an anamorphic embodiment. For example, it has different imaging scales βx, βy in the x- and y-directions. The two imaging scales βx, βy of the projection optical unit 10 can be (βx, βy)=(+/−0.25, +/−0.125). A positive imaging scale β means imaging without image inversion. A negative sign for the imaging scale β means imaging with image inversion.

The projection optical unit 10 consequently leads to a reduction in size with a ratio of 4:1 in the x-direction, that is to say in a direction perpendicular to the scanning direction.

The projection optical unit 10 leads to a reduction in size of 8:1 in the y-direction, that is to say in the scanning direction.

Other imaging scales are likewise possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 5 and the image field 11 can be the same or, depending on the embodiment of the projection optical unit 10, can differ. Examples of projection optical units with different numbers of such intermediate images in the x- and y-directions are known from US 2018/0074303 A1.

In each case one of the pupil facets 23 is assigned to exactly one of the field facets 21 for forming in each case an illumination channel for illuminating the object field 5. This can yield illumination according to the Köhler principle. The far field is decomposed into a multiplicity of object fields 5 with the aid of the field facets 21. The field facets 21 generate a plurality of images of the intermediate focus on the pupil facets 23 respectively assigned thereto.

The field facets 21 are imaged, in each case by way of an assigned pupil facet 23, onto the reticle 7 in a manner such that they are superposed on one another for the purposes of illuminating the object field 5. The illumination of the object field 5 can be as homogeneous as possible. It can have a uniformity error of less than 2%. The field uniformity can be achieved by way of the superposition of different illumination channels.

The illumination of the entrance pupil of the projection optical unit 10 can be defined geometrically by way of an arrangement of the pupil facets. The intensity distribution in the entrance pupil of the projection optical unit 10 can be set by selecting the illumination channels, in particular the subset of pupil facets, which guide light. This intensity distribution is also referred to as illumination setting.

A likewise preferred pupil uniformity in the region of sections of an illumination pupil of the illumination optical unit 4 which are illuminated in a defined manner can be achieved by a redistribution of the illumination channels.

Further aspects and details of the illumination of the object field 5 and of the entrance pupil of the projection optical unit 10 are described below.

The projection optical unit 10 can have a homocentric entrance pupil. The latter can be accessible. It can also be inaccessible.

The entrance pupil of the projection optical unit 10 cannot regularly be exactly illuminated using the pupil facet mirror 22. In the case of imaging of the projection optical unit 10 which telecentrically images the centre of the pupil facet mirror 22 onto the wafer 13, the aperture rays often do not intersect at a single point. However, it is possible to find an area in which the distance of the aperture rays determined in pairs becomes minimal. This area represents the entrance pupil or an area in real space that is conjugate thereto. This area can have a finite curvature.

It may be the case that the projection optical unit 10 has different positions of the entrance pupil for the tangential beam path and for the sagittal beam path. In this case, an imaging element, for example an optical component of the transfer optical unit, is provided between the second facet mirror 22 and the reticle 7. With the aid of this optical element, the different positions of the tangential entrance pupil and the sagittal entrance pupil can be taken into account.

In the arrangement of the components of the illumination optical unit 4 illustrated in FIG. 1, the pupil facet mirror 22 is arranged in an area conjugate to the entrance pupil of the projection optical unit 10. The field facet mirror 20 is arranged in tilted fashion with respect to the object plane 6.

The first facet mirror 20 is arranged in tilted fashion with respect to an arrangement plane defined by the deflection mirror 19.

The first facet mirror 20 is arranged in tilted fashion with respect to an arrangement plane defined by the second facet mirror 22.

Figure 2:
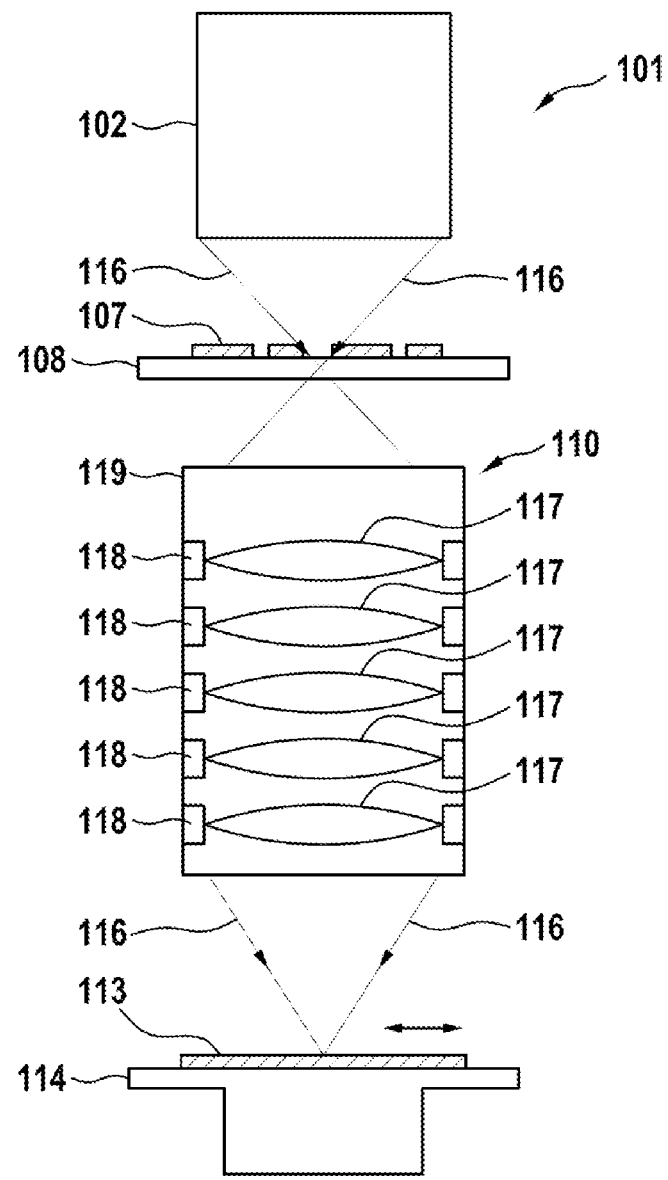

FIG. 2 schematically shows a meridional section of a further projection exposure apparatus 101 for DUV projection lithography, in which the disclosure can likewise be used.

The construction of the projection exposure apparatus 101 and the principle of the imaging are generally comparable with the construction and procedure described in FIG. 1. Identical component parts are designated by a reference sign increased by 100 relative to FIG. 1, i.e. the reference signs in FIG. 2 begin with 101.

In contrast to an EUV projection exposure apparatus 1 as described in FIG. 1, refractive, diffractive and/or reflective optical elements 117, such as for example lens elements, mirrors, prisms, terminating plates, and the like, can be used for imaging or for illumination in the DUV projection exposure apparatus 101 on account of the greater wavelength of the DUV radiation 116, employed as used light, in the range of 100 nm to 300 nm, such as 193 nm. The projection exposure apparatus 101 in this case substantially comprises an illumination system 102, a reticle holder 108 for receiving and exactly positioning a reticle 107 provided with a structure, by which the later structures on a wafer 113 are determined, a wafer holder 114 for holding, moving and exactly positioning the wafer 113 and a projection lens 110, with a plurality of optical elements 117, which are held by way of mounts 118 in a lens housing 119 of the projection lens 110.

The illumination system 102 provides DUV radiation 116 for imaging the reticle 107 on the wafer 113. A laser, a plasma source or the like can be used as the source of this radiation 116. The radiation 116 is shaped in the illumination system 102 via optical elements such that the DUV radiation 116 has the desired properties with regard to diameter, polarization, shape of the wavefront and the like when it is incident on the reticle 107.

Apart from the additional use of refractive optical elements 117, such as lens elements, prisms, terminating plates, the construction of the downstream projection optical unit 110 with the lens housing 119 does not differ in principle from the construction described in FIG. 1 and is therefore not described in further detail.

Figure 3A:
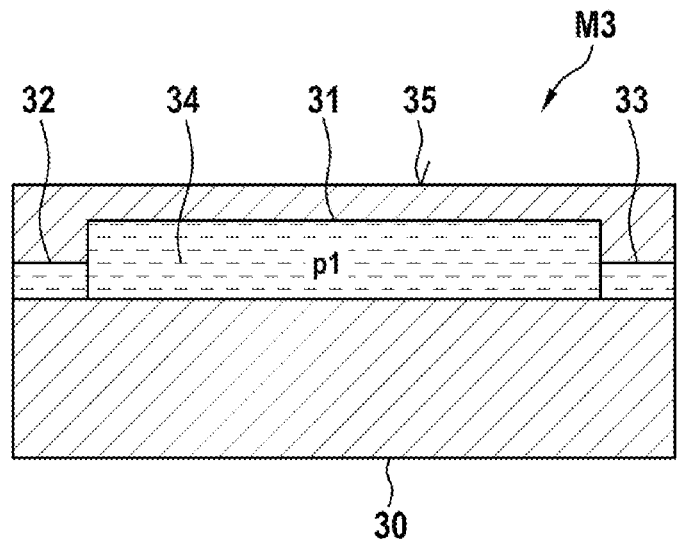
FIGS. 3A-3B show a component known from the prior art.

FIG. 3A shows a component known from the prior art, such as the mirror M3 described in FIG. 1, for example, the mirror M3 comprising a main body 30 with a fluid channel 31. The fluid channel 31 comprises a connection 32 for a supply line (not illustrated) of a fluid 34 for regulating the temperature of the mirror M3 and a connection 33 for an outgoing line (not illustrated) of the fluid 34. The main body 30 furthermore comprises an optical effective surface 35, which is embodied in plane fashion at a nominal pressure p1 in the fluid channel 31 in the embodiment shown, the nominal pressure p1 being the pressure at which the optical effective surface 35 corresponds to the target effective surface. Any deviation from the nominal pressure p1 also leads, owing to deformation of the optical effective surface 35, to a change in the optical effect and hence a deterioration in the imaging quality of the projection exposure apparatus.

Figure 3B:
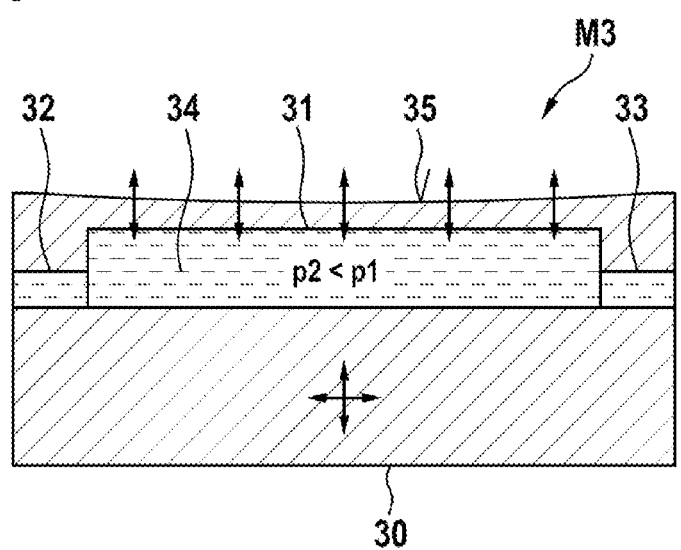

FIG. 3B likewise shows the mirror M3, the fluid 34 in the fluid channel 31 having a pressure p2 that is less than the nominal pressure p1. This causes a deformation of the optical effective surface 35, which forms a concave shape in the situation shown in FIG. 3B. If the pressure p of the fluid 34 fluctuates over time, this leads not only to the deformations of the optical effective surface 35 but also to an excitation of the mirror M3, which changes its position and/or orientation as a result. The deformation and the movement of the optical effective surface 35 lead to a change in the optical imaging which leads to a deterioration in the imaging quality of the projection exposure apparatus 1.

Figure 4:
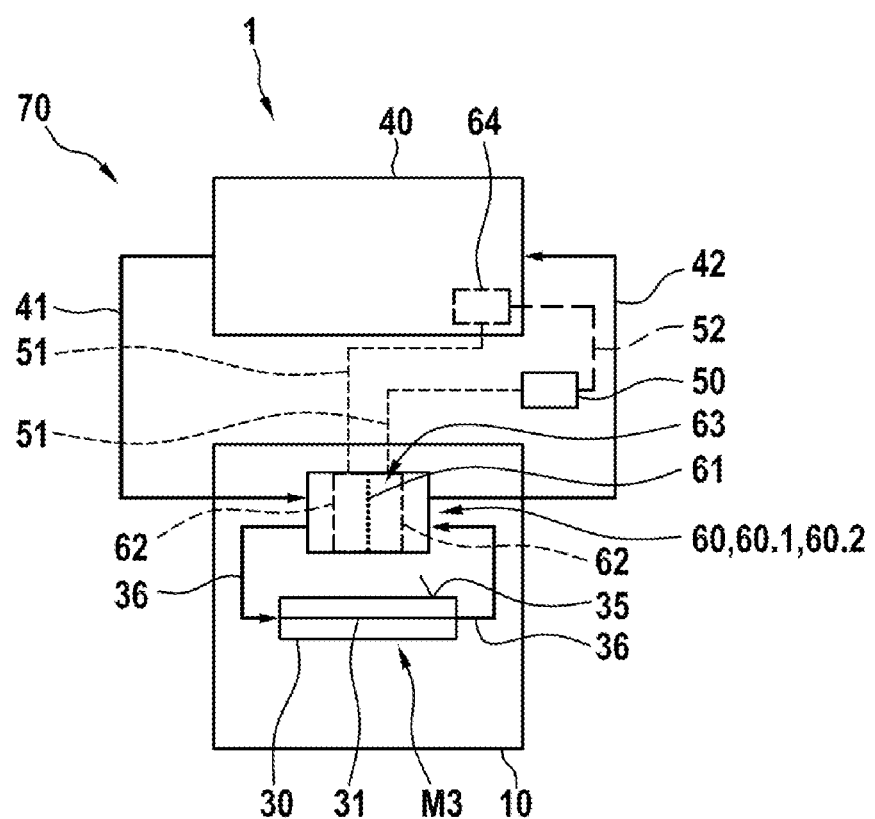
FIG. 4 shows an embodiment of the disclosure.

FIG. 4 shows part of an EUV projection exposure apparatus 1 having a water cabinet 40, and a projection optical unit 10 having a component which corresponds to the mirror M3 already illustrated in the embodiment in FIGS. 3A, 3B. The water cabinet 40 is configured to condition, regulate the temperature of, and provide the fluid 34 used for flowing through the mirror (the fluid not being illustrated separately in the figure). The water cabinet 40 is connected to a short circuit 60 via a supply line 41 and an outgoing line 42, the short circuit in turn being connected to a fluid channel 31 in the main body 30 of the mirror M3 via connecting lines 36. In this case, the connecting lines 36 are embodied in decoupling fashion in such a way that movements of the short circuit 60 are not passed on to the mirror M3, or are passed on thereto only to a small extent. In a first embodiment of the short circuit 60, the fluid 34 coming from the water cabinet 40 via the supply line 41 flows both via the short circuit 60 directly into the outgoing line 42 and via the connecting line 36 through the fluid channel 31 of the mirror M3 and a second connecting line 36 and the short circuit 60 to the outgoing line 42 and subsequently further, back to the water cabinet 40. The short circuit 60 has the advantage that as a result of the direct connection of the supply line 41 directly upstream of the mirror M3 and the outgoing line 42 directly downstream of the mirror M3 via the short circuit 60, a pressure difference between these two points is equalized. The pressure difference is caused firstly by the pressure loss in the mirror M3 and secondly by the difference in the average pressure of the pressure fluctuations formed as a standing wave upstream and downstream of the mirror M3. The pressure fluctuations form in the incompressible fluid system 70, the fluid system 70 comprising all component parts through which the fluid 34 flows, that is to say water cabinet 40, supply line 41, outgoing line 42, connecting line 36 and fluid channel 31. The amplitudes of the pressure fluctuations attain their maximum in the centre of a standing wave, lying in the region of the mirror M3. The deviation of the centre of the standing wave and the centre of the mirror M3 has the effect that the average pressure of the pressure fluctuations is at different levels and hence a force resulting from the difference acts on the mirror M3. This tends towards zero or is at least reduced to a minimum by the pressure equalization upstream and downstream of the mirror M3, the pressure equalization being caused by the short circuit 60. The pressure loss via the short circuit 60 is disregarded in this case. The short circuit 60 is secured to a frame (not illustrated), which is mechanically decoupled from the mirror M3 and the suspension thereof (not illustrated). As a result, the mechanical disturbances caused by flow-induced vibrations in the short circuit 60 are absorbed by the frame, whereby entry into the mirror M3 can be significantly reduced. The remaining excitation of the short circuit 60, as described further above, is reduced further by the connecting lines 36, embodied in decoupling fashion, from the short circuit 60 to the mirror M3. This has the consequence that the asymmetric disturbances caused by a pressure difference as a result of flow-induced vibrations in the mirror M3, and also the forces acting on the mirror M3 by way of the pressure fluctuations present are advantageously minimized or even completely avoided. This in turn reduces the displacement and/or tilting of the mirror, as a result of which the imaging quality of the projection exposure apparatus is improved.

Alternatively, the short circuit 60 can also be embodied as an acoustic short circuit 60.1, in which case in the short circuit 60.1 the membrane 61 illustrated in a dotted manner in FIG. 4 is embodied in the short circuit 60.1. The membrane 61 furthermore equalizes the pressure difference upstream and downstream of the mirror M3, but prevents flow through the short circuit 60. The fluid 34, as already explained further above, flows completely through the mirror M3 via the connecting lines 36 and the fluid channel 31. This has the advantage that the volumetric flow rate through the mirror M3 and thus the temperature-regulating capacity of the fluid 34 can be set more easily and a lower total volumetric flow rate in the fluid system 70 is used by comparison with the variant outlined above.

A further embodiment of the acoustic short circuit 60.2 comprises a double membrane, the membranes 62 of which are illustrated as dashed lines in FIG. 4, the volume 63 formed between the membranes 62 having a compressible medium, such as gas, for example. The membrane 61 illustrated in a dashed manner is not part of the short circuit 60.2 in this case. The membranes 62 completely separate the fluid 34 from the gas, such that the closed fluid system 70 comprises a compliance by virtue of the gas volume between the membranes 62. The compressible gas acts like a spring, such that the bandwidth of the gas volume 63 acting as a filter and thus the periodic pressure fluctuations that are filtered by the gas volume 63 can be set by way of the gas pressure of the volume 63, corresponding to a spring stiffness of the gas volume 63. As already mentioned, the static pressure in the fluid system 70 should be kept constant in this case. It is likewise conceivable to choose the volumetric content of the gas volume 63 suitably beforehand in order to set the bandwidth. The forces absorbed by the compression of the gas are not transmitted to the mirror M3 owing to the short circuit 60.2 being secured to a dedicated frame (not illustrated). The compliance results in a transformation of the amplitudes of the pressure fluctuations into an increase in the flow velocity of the fluid 34. As a result, the amplitudes of the pressure fluctuations downstream of the short circuit 60.2, that is to say in the mirror M3, are significantly reduced and converted into volumetric flow rate changes that are less relevant to the position and orientation of the mirror M3 and also the deformation of the optical effective surface 35.

The volume 63 is connected to a pressure control unit 50 via a gas line 51. The pressure control unit is arranged outside a projection optical unit 10 of the kind illustrated in FIG. 1 and comprising the mirror M3. The pressure control unit 50 detects the pressure in the volume 63 and determines therefrom the pressure of the fluid 34 in the mirror M3. The latter directly affects the deformation of the optical effective surface 35 of the mirror M3 and therefore is desirably always constant. The optical effective surface 35, as explained in FIGS. 3A, 3B, is produced on the basis of a nominal pressure p1 in the fluid channel 31. The pressure of the gas volume 63 determined by the pressure control unit 50 is forwarded via a signal line 52 to a pressure control unit 64 in the water cabinet 40, such that the pressure control unit 64 can adapt the pressure in the fluid system 70 in such a way that the nominal pressure p1 is present in the fluid channel 31 of the mirror M3. In another embodiment, the gas volume 63 can also be directly connected to the pressure control unit 64 via the gas line 51, as a result of which the pressure control unit 50 can be omitted.

As an alternative to adapting the pressure of the fluid system 70 in the water cabinet 40, it is also conceivable to adapt the pressure in the fluid channel 31 by way of the gas volume 63 in the short circuit 60.2, this being possible only for very low pressures and for fluid systems 70 having a static pressure and a very low volumetric flow rate.

LIST OF REFERENCE SIGNS

1 Projection exposure apparatus
2 Illumination system
3 Radiation source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
15 Wafer displacement drive
16 EUV radiation
17 Collector
18 Intermediate focal plane
19 Deflection mirror
20 Facet mirror
21 Facets
22 Facet mirror
23 Facets
M1-M6 Mirrors
30 Main body
31 Fluid channel
32 Connection for supply line
33 Connection for outgoing line
34 Fluid
35 Optical effective surface
36 Connecting line to the short circuit
40 Water cabinet
41 Supply line
42 Outgoing line
50 Pressure control unit
51 Gas line
52 Signal line
60, Short circuit
61 Membrane
62 Double membrane
63 Volume
64 Pressure control unit
70 Fluid system
101 Projection exposure apparatus
102 Illumination system
107 Reticle
108 Reticle holder
110 Projection optical unit
113 Wafer
114 Wafer holder
116 DUV radiation
117 Optical element
118 Mounts
119 Lens housing

What is claimed is:

1. An apparatus, comprising:

a component comprising an inlet, an outlet and a fluid channel; and a device configured to provide a fluid to flow through the fluid channel, the device comprising an inlet and an outlet;

an acoustic short circuit comprising a member selected from the group consisting of a membrane and a double membrane, wherein:
- the acoustic short circuit comprises a first inlet, a second inlet different from the first inlet, a first outlet, and a second outlet different from the first outlet;
- the apparatus has a first fluid flow path from the outlet of the device to the first inlet of the acoustic short circuit and from the first outlet of the acoustic short circuit to the inlet of the component;
- the apparatus has a second fluid flow path from the inlet of the component along the fluid channel to the outlet of the component;
- the apparatus has a third fluid flow path from the outlet of the component to the second inlet of the acoustic short circuit and from the second outlet of the acoustic short circuit to the inlet of the device;
- along the first fluid flow path, the fluid applies pressure to a first side of the member;
- along the third fluid flow path, the fluid applies pressure to a second side of the member;
- the second side of the member is different from the first side of the member; and
- the apparatus is a projection exposure apparatus for semiconductor lithography.

2. The apparatus of claim 1, wherein the member comprises the membrane.

3. The apparatus of claim 2, wherein the acoustic short circuit is supported by a frame decoupled from the component.

4. The apparatus of claim 3, wherein the device comprises a pressure control unit.

5. The apparatus of claim 2, wherein the device comprises a pressure control unit.

6. The apparatus of claim 1, wherein the member comprises the double membrane.

7. The apparatus of claim 6, further comprising a compressible medium in a volume between the double membrane.

8. The apparatus of claim 7, wherein the device comprises a pressure control unit.

9. The apparatus of claim 8, wherein the pressure control unit is connected to the volume between the double membrane.

10. The apparatus of claim 6, further comprising a damping element in a volume between the double membrane.

11. The apparatus of claim 10, wherein the device comprises a pressure control unit.

12. The apparatus of claim 11, wherein the pressure control unit is connected to the volume between the double membrane.

13. The apparatus of claim 6, wherein the device comprises a pressure control unit.

14. The apparatus of claim 13, wherein at least one of the following holds:
- the pressure control unit is connected to a volume between the double membrane;
- the pressure control unit is configured to detect a pressure in a volume between the double membrane;
- the pressure control unit comprises an actuator configured to set a pressure in a volume between the double membrane; and
- the pressure control unit is configured to control and/or regulate a pressure in a volume between the double membrane.

15. The apparatus of claim 1, wherein the acoustic short circuit is supported by a frame decoupled from the component.

16. The apparatus of claim 15, wherein the device comprises a pressure control unit.

17. The apparatus of claim 1, wherein the device comprises a pressure control unit.

18. The apparatus of claim 1, wherein the component comprises a mirror.

19. The apparatus of claim 1, wherein the second side of the member is opposite the first side of the member.

20. The apparatus of claim 1, further comprising:
- a supply line between the outlet of the device and the first inlet of the acoustic short circuit;
- a first connecting line between the first outlet of the acoustic short circuit and the inlet of the component;
- a second connecting line between the outlet of the component and the second inlet of the acoustic short circuit; and
- an outgoing line from the second outlet of the acoustic short circuit to the inlet of the device.

* * * * *